(12) United States Patent
Cheng et al.

(10) Patent No.: US 10,651,268 B2
(45) Date of Patent: May 12, 2020

(54) METAL-OXIDE-METAL CAPACITOR WITH IMPROVED ALIGNMENT AND REDUCED CAPACITANCE VARIANCE

(71) Applicant: QUALCOMM Incorporated, San Diego, CA (US)

(72) Inventors: Haitao Cheng, San Diego, CA (US); Ye Lu, San Diego, CA (US); Chao Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/009,976

(22) Filed: Jun. 15, 2018

(65) Prior Publication Data
US 2019/0386092 A1    Dec. 19, 2019

(51) Int. Cl.
*H01L 29/00*        (2006.01)
*H01L 49/02*        (2006.01)

(52) U.S. Cl.
CPC .................... *H01L 28/88* (2013.01)

(58) Field of Classification Search
CPC .......................................... H01L 23/88
See application file for complete search history.

(56) References Cited

U.S. PATENT DOCUMENTS

| | | | |
|---|---|---|---|
| 7,485,914 B2 | 2/2009 | Huang et al. | |
| 8,558,350 B2 | 10/2013 | Huang et al. | |
| 8,836,079 B2 | 9/2014 | Li et al. | |
| 9,269,492 B2 | 2/2016 | Zhu et al. | |
| 9,472,612 B2 | 10/2016 | Kuo et al. | |
| 2004/0031982 A1* | 2/2004 | Devries ............... | H01L 27/0805 257/307 |

* cited by examiner

*Primary Examiner* — Hung K Vu
(74) *Attorney, Agent, or Firm* — Qualcomm Incorporated/Seyfarth

(57) ABSTRACT

A capacitor has reduced misalignment in the interconnect layers and lower capacitance variance. The capacitor includes a first endcap having a first section and a second section orthogonal to the first section. The capacitor includes a first set of conductive fingers orthogonally coupled to the first section. The capacitor includes a third set of conductive fingers orthogonally coupled to the second section of the endcap and a second endcap parallel to the first section of the endcap. The capacitor includes a second set of conductive fingers orthogonally coupled to a second endcap and interdigitated with the first set of conductive fingers at a first interconnect layer. The capacitor includes a third endcap parallel to the second section of the first endcap and a fourth set of conductive fingers orthogonally coupled to the third endcap and interdigitated with the third set of conductive fingers at the first interconnect layer.

4 Claims, 11 Drawing Sheets

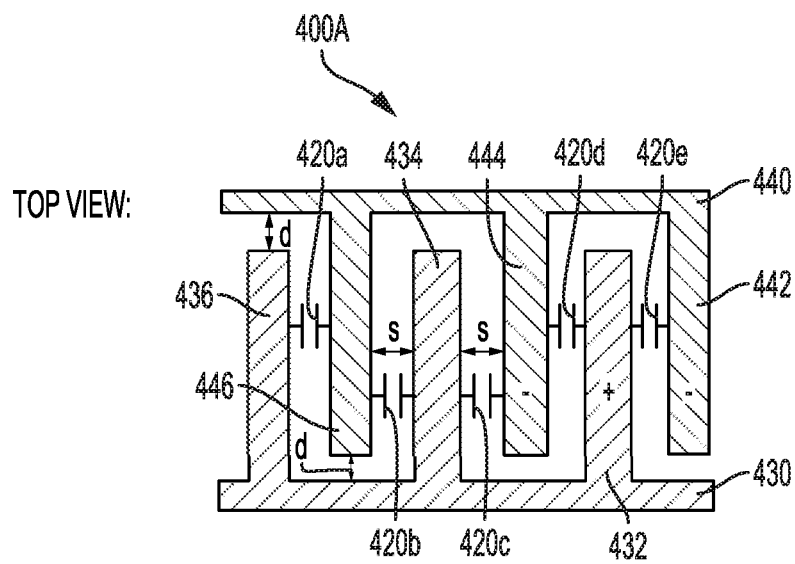
FIG. 4A
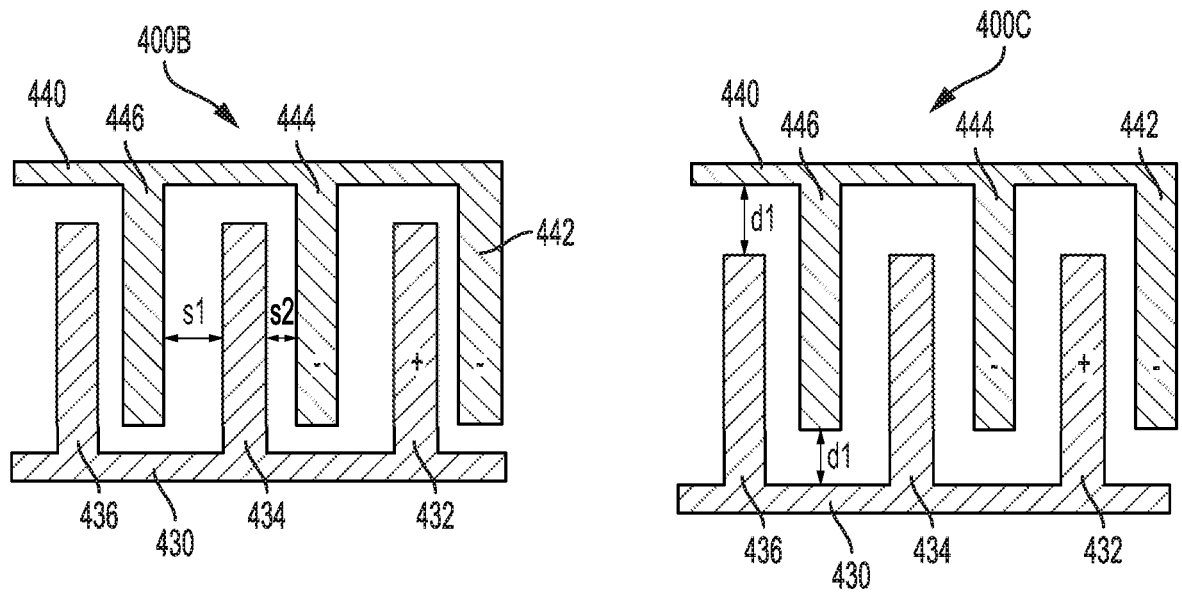
FIG. 4B
FIG. 4C

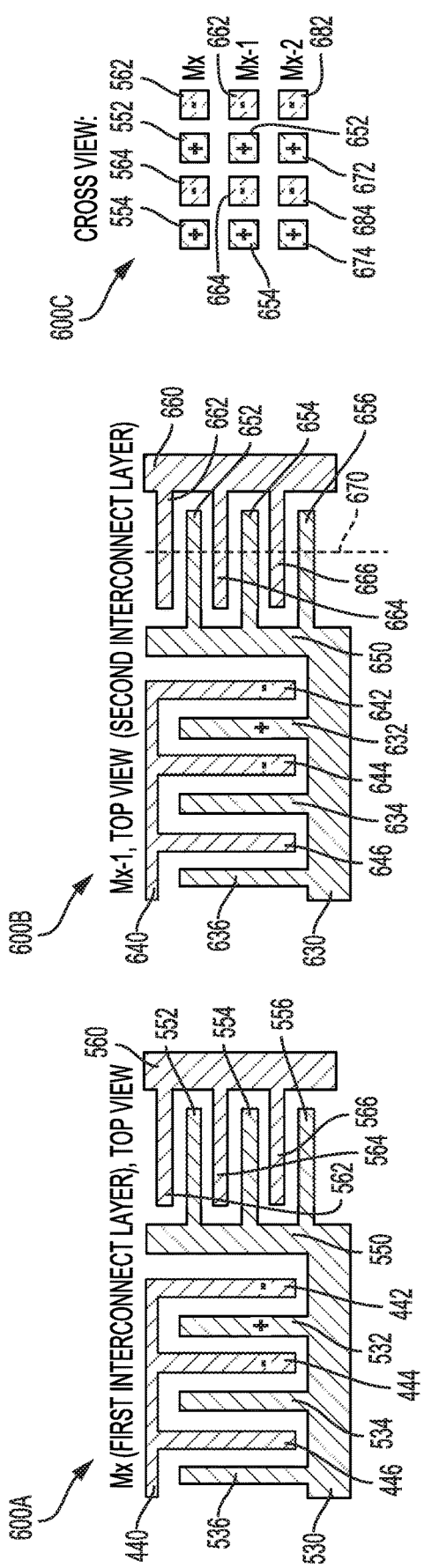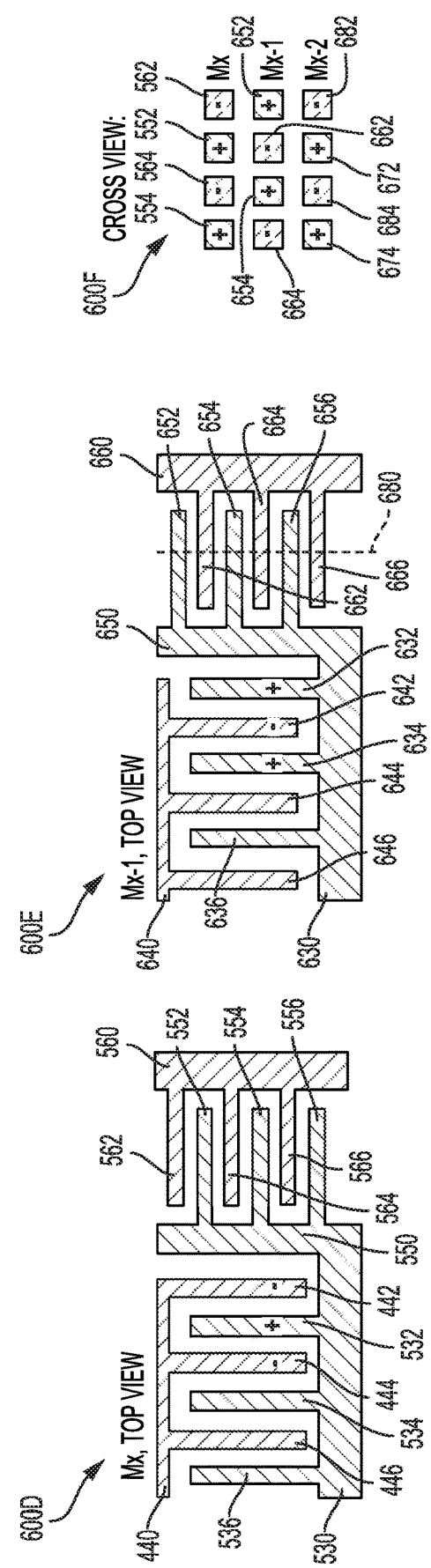

METAL-OXIDE-METAL CAPACITOR WITH IMPROVED ALIGNMENT AND REDUCED CAPACITANCE VARIANCE

BACKGROUND

Field

Aspects of the present disclosure relate to semiconductor devices and, more particularly, to a metal-oxide-metal (MOM) capacitor with robust alignment and reduced capacitance variance.

Background

Mobile radio frequency (RF) chips (e.g., mobile RF transceivers) have migrated to a deep sub-micron process node due to cost and power consumption considerations. Designing mobile RF transceivers is further complicated by added circuit functions for supporting communication enhancements, such as carrier aggregation. Further design challenges for mobile RF transceivers include using passive devices, which directly affect analog/RF performance considerations, including mismatch, noise, and other performance considerations.

Passive devices may involve high performance capacitor components. For example, analog integrated circuits use various types of passive devices, such as integrated capacitors. These integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. MOM capacitors are also known as vertical parallel plate (VPP) capacitors, natural vertical capacitors (NVCAP), lateral flux capacitors, comb capacitors, as well as interdigitated finger capacitors. MOM capacitors exhibit beneficial characteristics including high capacitance density, low parasitic capacitance, superior RF characteristics, and good matching characteristics without additional masks or process steps relative to other capacitor structures.

MOM capacitors are one of the most widely used capacitors due to their beneficial characteristics. MOM capacitor structures realize capacitance by using the fringing capacitance produced by sets of interdigitated fingers. For example, MOM capacitors harness lateral capacitive coupling between plates formed by metallization layers and wiring traces.

The MOM capacitors, however, may be subject to misalignment in each interconnect layer during a fabrication process, such as double patterning lithography and may also be subject to capacitance variance.

SUMMARY

A capacitor may include a first endcap having a first section and a second section that is orthogonal to the first section. The capacitor also includes a first set of conductive fingers orthogonally coupled to the first section of the first endcap. The capacitor also includes a third set of conductive fingers orthogonally coupled to the second section of the first endcap. The capacitor further includes a second endcap parallel to the first section of the first endcap. The capacitor further includes a second set of conductive fingers orthogonally coupled to the second endcap and interdigitated with the first set of conductive fingers at a first interconnect layer. Furthermore, the capacitor includes a third endcap parallel to the second section of the first endcap and a fourth set of conductive fingers orthogonally coupled to the third endcap and interdigitated with the third set of conductive fingers at the first interconnect layer.

A method of making a capacitor may include fabricating, with a first mask, a first endcap having a first section and a second section that is orthogonal to the first section. The method may also include fabricating, with the first mask, a first set of conductive fingers orthogonally coupled to the first section of the first endcap. The method further includes fabricating, with the first mask, a third set of conductive fingers orthogonally coupled to the second section of the first endcap. The method also includes fabricating, with a second mask, a second endcap parallel to the first section of the first endcap. The method further includes fabricating, with the second mask, a second set of conductive fingers orthogonally coupled to the second endcap and interdigitated with the first set of conductive fingers at a first interconnect layer. The method further includes fabricating, with the second mask, a third endcap parallel to the second section of the first endcap. Furthermore, the method includes fabricating, with the second mask, a fourth set of conductive fingers orthogonally coupled to the third endcap and interdigitated with the third set of conductive fingers at the first interconnect layer.

A capacitor may include a first endcap having a first section and a second section that is orthogonal to the first section. The capacitor also includes a first set of conductive fingers orthogonally coupled to the first section of the first endcap. The capacitor also includes a third set of conductive fingers orthogonally coupled to the second section of the first endcap. The capacitor further includes first means for receiving/transmitting charge to/from the capacitor parallel to the first section of the first endcap. The capacitor further includes a second set of conductive fingers orthogonally coupled to the first charge receiving/transmitting means and interdigitated with the first set of conductive fingers at a first interconnect layer. Furthermore, the capacitor includes second means for receiving/transmitting charge to/from the capacitor parallel to the second section of the first endcap and a fourth set of conductive fingers orthogonally coupled to the second charge receiving/transmitting means and interdigitated with the third set of conductive fingers at the first interconnect layer.

This has outlined, rather broadly, the features and technical advantages of the present disclosure in order that the detailed description that follows may be better understood. Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIGS. 4A-4C illustrate top views of metal-oxide-metal (MOM) capacitor structures subject to misalignment in an interconnect layer during a fabrication process.

FIG. 6A and FIG. 6B respectively illustrate top views of first and second conductive interconnect layers of metal-oxide-metal (MOM) capacitor structures with reduced misalignment in each of the first and second conductive interconnect layers and reduced capacitance variance, according to aspects of the present disclosure.

FIG. 6C illustrates a cross-section of a portion of the multiple conductive interconnect layers of the metal-oxide-metal (MOM) capacitor structures of FIGS. 6A and 6B with reduced misalignment in one or more of the interconnect layers and reduced capacitance variance, according to aspects of the present disclosure.

FIG. 6D and FIG. 6E respectively illustrate top views of first and second conductive interconnect layers of metal-oxide-metal (MOM) capacitor structures with reduced misalignment in each of the first and second conductive interconnect layers and reduced capacitance variance, according to aspects of the present disclosure.

FIG. 6F illustrates a cross-section of a portion of the multiple conductive interconnect layers of the metal-oxide-metal (MOM) capacitor structures of FIGS. 6D and 6E with reduced misalignment in one or more of the interconnect layers and reduced capacitance variance, according to aspects of the present disclosure.

DETAILED DESCRIPTION

Figure 1:
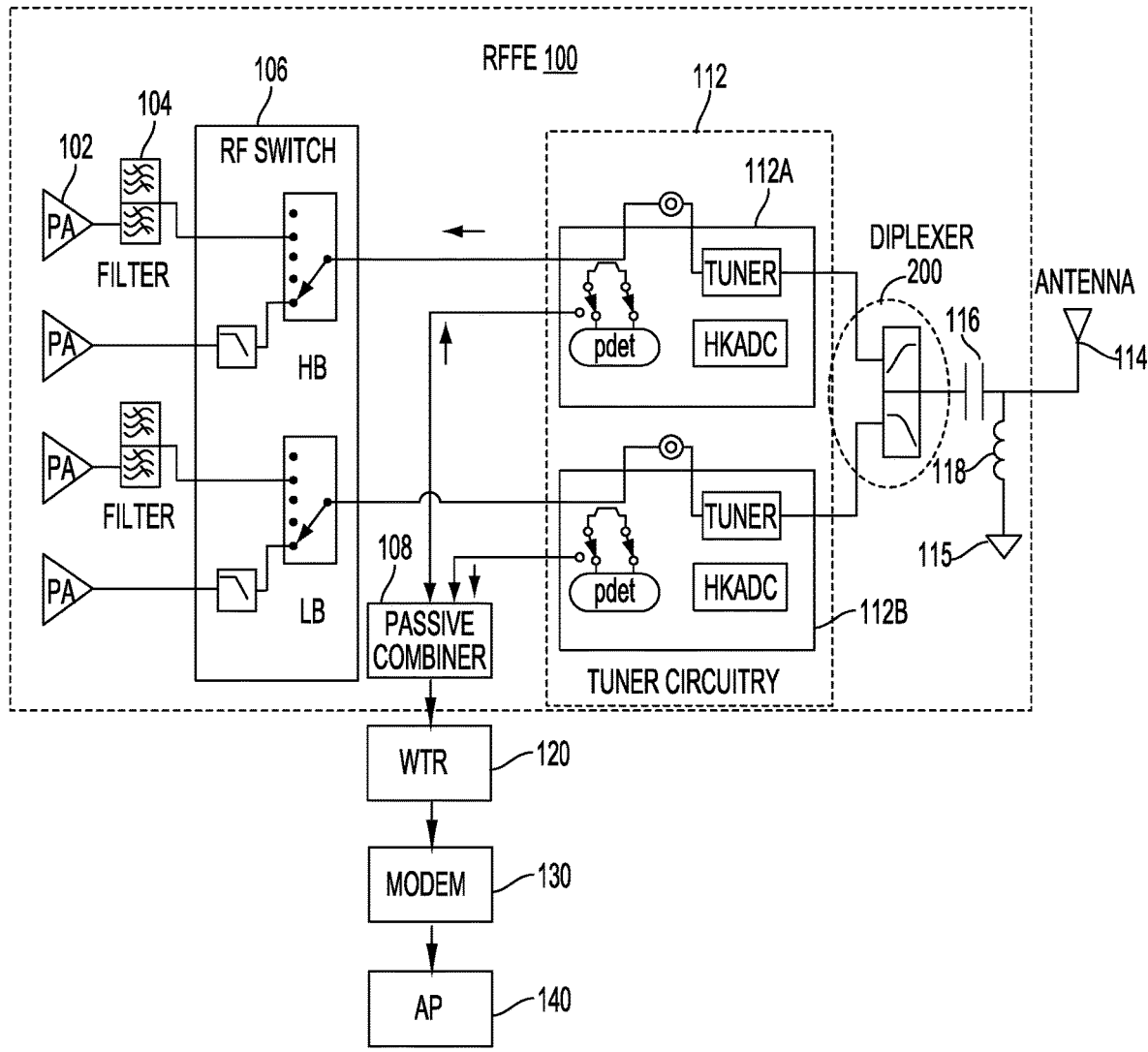
FIG. 1 is a schematic diagram of a radio frequency (RF) front end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR", and the use of the term "or" is intended to represent an "exclusive OR". As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Passive devices in mobile RF transceivers may include high performance capacitor components. For example, analog integrated circuits use various types of passive devices, such as integrated capacitors. These integrated capacitors may include metal-oxide-semiconductor (MOS) capacitors, p-n junction capacitors, metal-insulator-metal (MIM) capacitors, poly-to-poly capacitors, metal-oxide-metal (MOM) capacitors, and other like capacitor structures. Capacitors are generally passive elements used in integrated circuits for storing an electrical charge. For example, parallel plate capacitors are often made using plates or structures that are conductive with an insulating material between the plates. The amount of storage, or capacitance, for a given capacitor is contingent upon the materials used to make the plates and the insulator, the area of the plates, and the spacing between the plates. The insulating material is often a dielectric material.

These parallel plate capacitors, however, often take up a large area on a semiconductor chip because many designs place the capacitor over the substrate of the chip. Unfortunately, this approach reduces the available area for active devices. Another approach is to create a vertical structure, which may be known as a vertical parallel plate (VPP) capacitor. VPP capacitor structures may be created through stacking of the interconnect layers on a chip.

VPP capacitors structures, however, have lower capacitive storage, or lower density, in that these structures do not store much electrical charge. In particular, the interconnect and via layer interconnect traces used to fabricate VPP capacitors may be very small in size. The spacing between the interconnects and via layer conductive traces in VPP structures is limited by design rules, which often results in a large area for achieving certain desired capacitance for such structures. Although described as "vertical," these structures can be in any direction that is substantially perpendicular to the surface of the substrate, or at other angles that are not substantially parallel to the substrate.

A MOM capacitor as well as a MOS capacitor are examples of VPP capacitors. MOM capacitors are one of the most widely used capacitors due to their beneficial characteristics. In particular, MOM capacitors are used for providing high quality capacitors in semiconductor processes without incurring the cost of an extra processing step relative to other capacitor structures. MOM capacitor structures realize capacitance by using the fringing capacitance produced by sets of interdigitated fingers. For example, MOM capacitors harness lateral capacitive coupling between plates formed by metallization layers and wiring traces.

MOM capacitors may be subject to misalignment in the interconnect layer during a fabrication process such as double patterning lithography and may also be subject to capacitance variance. Thus, it is desirable to have a MOM capacitor that matches simulation models as closely as possible for circuit design. However, capacitance variance between fabrication and simulation cannot be avoided due to the double patterning process in advanced processes (14 nanometer (nm) and below). The misalignment in the interconnect layer randomly happens in horizontal and vertical directions, which makes the capacitance variation unpredictable.

Various aspects of the present disclosure provide a MOM capacitor with reduced misalignment in the interconnect layer and reduced capacitance variance. For example, the proposed MOM capacitor decreases the capacitance variance by half relative to a conventional implementation when a same probability of occurrence of the capacitance variance exists. The aspects of the present disclosure are characterized by much smaller probability relative to the conventional implementation for a same amount of variance.

The process flow for fabrication of the capacitor may include front-end-of-line (FEOL) processes, middle-of-line (MOL) processes, and back-end-of-line (BEOL) processes. As described, the back-end-of-line interconnect layers may refer to the conductive interconnect layers (e.g., a first interconnect layer (M1) or metal one M1, metal two (M2), metal three (M3), metal four (M4), etc.) for electrically coupling to front-end-of-line active devices of an integrated circuit. The various back-end-of-line interconnect layers are formed at corresponding back-end-of-line interconnect levels, in which lower back-end-of-line interconnect levels use thinner metal layers relative to upper back-end-of-line interconnect levels. The back-end-of-line interconnect layers may electrically couple to middle-of-line interconnect layers, for example, connecting the M1 layer to an oxide diffusion (OD) layer of an integrated circuit. The middle-of-line interconnect layer may include a zero interconnect layer (M0) for connecting the M1 layer to an active device layer of an integrated circuit. A back-end-of-line first via (V2) may connect the M2 layer to the M3 layer or others of the back-end-of-line interconnect layers. It will be understood that the term "layer" includes film and is not to be construed as indicating a vertical or horizontal thickness unless otherwise stated. As described, the term "substrate" may refer to a substrate of a diced wafer or may refer to a substrate of a wafer that is not diced. Similarly, the terms "chip" and "die" may be used interchangeably.

According to aspects of the present disclosure, a capacitor (e.g., a metal-oxide-metal (MOM) capacitor) is formed with reduced misalignment in the interconnect layer and reduced capacitance variance. In some aspects, an integrated circuit may include the MOM capacitor in at least one back-end-of-line (BEOL) interconnect level. The MOM capacitor may have a first endcap (or manifold) having a first section and a second section that is orthogonal to the first section. A first set of conductive fingers is orthogonally coupled to the first section of the first endcap. A third set of conductive fingers is orthogonally coupled to the second section of the first endcap. A second endcap is parallel to the first section of the first endcap. A second set of conductive fingers is orthogonally coupled to the second endcap and interdigitated with the first set of conductive fingers at a first interconnect layer. A third endcap is parallel to the second section of the first endcap. A fourth set of conductive fingers is orthogonally coupled to the third endcap and interdigitated with the third set of conductive fingers at the first interconnect layer.

In one aspect of the disclosure, a capacitance of the second set of conductive fingers interdigitated with the first set of conductive fingers is the same as a capacitance of the fourth set of conductive fingers interdigitated with the third set of conductive fingers. The endcaps may extend through multiple interconnect layers. The capacitor may further include a fifth set of conductive fingers orthogonally coupled to the first section of the first endcap at the second interconnect layer. A sixth set of conductive fingers is orthogonally coupled to the second section of the first endcap at the second interconnect layer. A seventh set of conductive fingers is orthogonally coupled to the second endcap at the second interconnect layer and interdigitated with the fifth set of conductive fingers at the second interconnect layer. An eighth set of conductive fingers is orthogonally coupled to the third endcap and interdigitated with the sixth set of conductive fingers at the second interconnect layer. In one aspect of the disclosure, the first set of conductive fingers and the fifth set of conductive fingers are aligned (e.g., geometrically). In other aspects of the present disclosure, the first set of conductive fingers and the fifth set of conductive fingers are staggered or not geometrically aligned.

FIG. 1 is a schematic diagram of a radio frequency (RF) front end (RFFE) module 100 employing passive devices including a capacitor 116 (e.g., a metal-oxide-metal capacitor) with reduced misalignment and reduced capacitance variance. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RF front end module 100.

The radio frequency (RF) front end module 100 also includes tuner circuitry 112 (e.g., first tuner circuitry 112A and second tuner circuitry 112B), the diplexer 200, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130, and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are contemplated.

Figure 2:
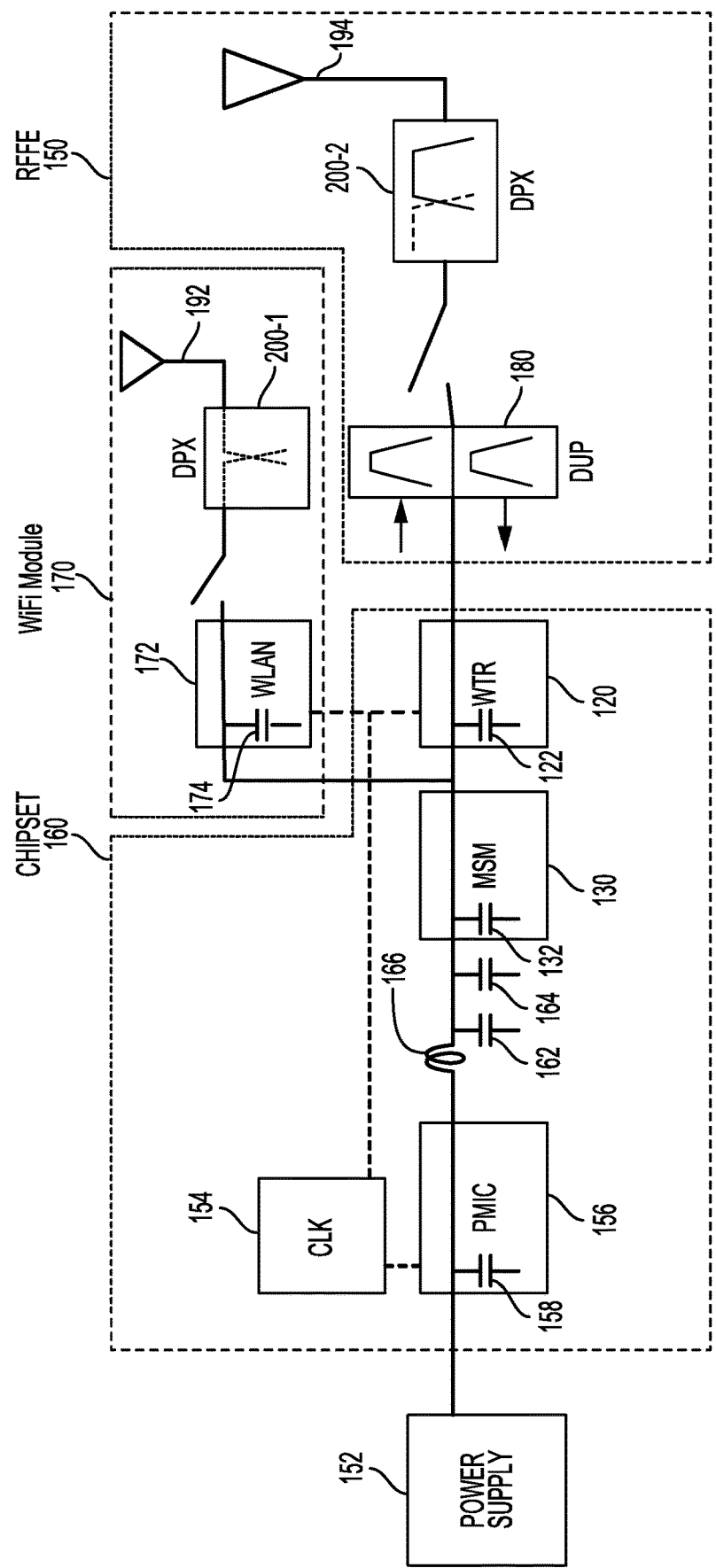
FIG. 2 is a schematic diagram of a radio frequency (RF) front end (RFFE) module employing passive devices for a chipset.

FIG. 2 is a schematic diagram of a wireless local area network (WLAN) (e.g., WiFi) module 170 including a first diplexer 200-1 and an RF front end (RFFE) module 150 including a second diplexer 200-2 for a chipset 160, including a capacitor with reduced misalignment and reduced capacitance variance. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 includes capacitors 162 and 164, as well as an inductor(s) 166 to provide signal integrity.

The PMIC 156, the modem 130, the wireless transceiver 120, and the WLAN module 172 each include capacitors (e.g., 158, 132, 122, and 174) and operate according to a clock 154. In addition, the inductor 166 couples the modem 130 to the PMIC 156. The geometry and arrangement of the various capacitors and inductor in the chipset 160 may consume substantial chip area. The design of the chipset 160 likely includes integrating MOM/MIM/MOS capacitors with inductors and/or transformers. Unfortunately, integrating MOM/MIM/MOS capacitors with inductors and/or transformers may degrade performance of the inductors and/or transformers. Consequently, conventional arrangements for implementing multi-turn inductors continue to consume unused area in RF integrated circuit (RFIC) analog devices.

Figure 3:
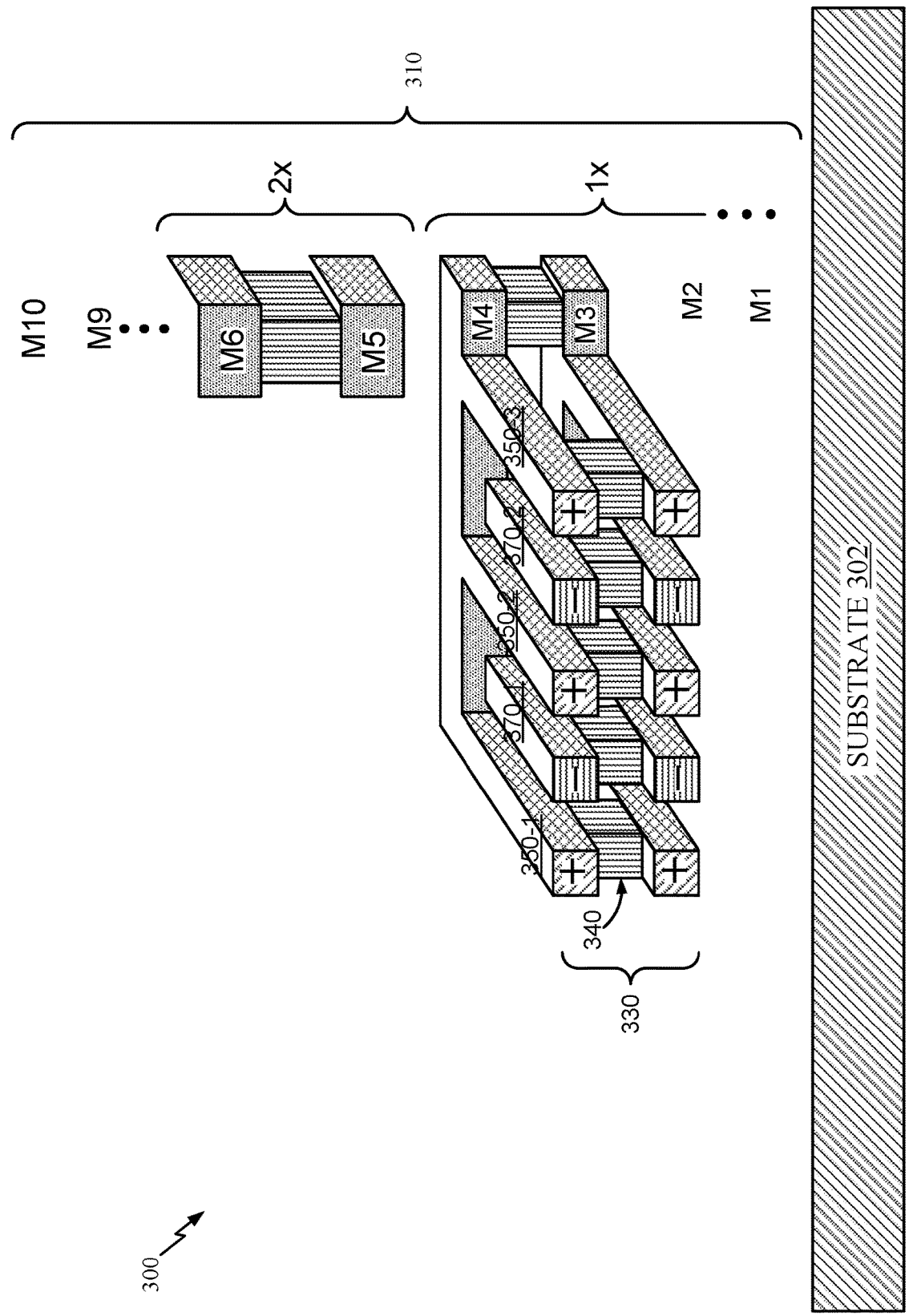
FIG. 3 is a cross-section illustrating an integrated circuit (IC) device including an interconnect stack that contains conventional metal-oxide-metal (MOM) capacitor structures.

Capacitors are widely used in analog integrated circuits. FIG. 3 is a block diagram illustrating a cross-section of an analog integrated circuit (IC) device 300 including an interconnect stack 310. The interconnect stack 310 of the IC device 300 includes multiple conductive interconnect layers (M1, . . . , M9, M10) on a semiconductor substrate (e.g., a diced silicon wafer) 302. The semiconductor substrate 302 support a metal-oxide-metal (MOM) capacitor 330 and/or a metal-oxide-semiconductor (MOS). In this example, the MOM capacitor 330 is formed in the M3 and M4 interconnect layers, below the M5 and M6 interconnect layers. The MOM capacitor 330 is formed from lateral conductive fingers of different polarities using the conductive interconnect layers (M3 and M4) of the interconnect stack 310. A dielectric (not shown) is provided between the conductive fingers.

In this example, the MOM capacitor 330 is formed within the lower conductive interconnect layers (e.g., M1-M4) of the interconnect stack 310. The lower conductive interconnect layers of the interconnect stack 310 have smaller interconnect widths and spaces. For example, the dimensions of the conductive interconnect layers M3 and M4 are half the size of the dimensions of the conductive interconnect layers M5 and M6. Likewise, the dimensions of the conductive interconnect layers M1 and M2 are half the size of the dimensions of the conductive interconnect layers M3 and M4. The small interconnect widths and spaces of the lower conductive interconnect layers enable the formation of MOM capacitors with increased capacitance density. As shown in FIG. 3, the MOM capacitor 330 makes use of a lateral (intra layer) capacitive coupling 340 between fingers (e.g., 350, 370) formed by standard metallization of the conductive interconnects (e.g., wiring lines and vias).

FIGS. 4A-4C illustrate top views of metal-oxide-metal (MOM) capacitor structures 400 (including a MOM capacitor structure 400A, a MOM capacitor structure 400B, and a MOM capacitor structure 400C) subject to misalignment in the interconnect layers during fabrication. Each of the MOM capacitor structures 400A-400C of FIGS. 4A-4C may be fabricated in one or more BEOL interconnect levels (e.g., M1-M4).

Referring to FIG. 4A, a top view of the MOM capacitor structure 400A includes a first capacitor routing terminal (e.g., endcap or manifold) 430 and a second endcap 440. The first endcap 430 is parallel to the second endcap 440. The first endcap 430 is of a first polarity (e.g., positive) while the second endcap 440 is of a second polarity (e.g., negative). A first set of parallel conductive capacitor routing traces (e.g., conductive fingers) of the MOM capacitor structure 400A include a first conductive finger 432, a second conductive finger 434, and a third conductive finger 436.

Each of the first conductive finger 432, the second conductive finger 434, and the third conductive finger 436 is orthogonally coupled to the first endcap 430. Each of the first conductive finger 432, the second conductive finger 434, and the third conductive finger 436 is of the first polarity.

A second set of parallel conductive fingers of the MOM capacitor structure 400A include a fourth conductive finger 442, a fifth conductive finger 444, and a sixth conductive finger 446. Each of the fourth conductive finger 442, the fifth conductive finger 444, and the sixth conductive finger 446 is orthogonally coupled to the second endcap 440. Each of the fourth conductive finger 442, the fifth conductive finger 444, and the sixth conductive finger 446 is of the second polarity.

The first set of parallel conductive fingers are interdigitated with the second set of parallel conductive fingers at a first interconnect layer to form an array of capacitors 420 (including a first capacitor 420a, a second capacitor 420b, a third capacitor 420c, a fourth capacitor 420d, and a fifth capacitor 420e) between the conductive fingers of the first polarity and the conductive fingers of the second polarity. For example, the second capacitor 420b of the array of capacitors 420 is formed between the second conductive finger 434, which is a conductive finger of the first polarity and the sixth conductive finger 446, which is a conductive finger of the second polarity. The third capacitor 420c of the array of capacitors 420 is formed between the second conductive finger 434 and the fifth conductive finger 444.

The first endcap 430 is parallel to the second endcap 440 such that a first gap separates the first set of parallel conductive fingers from the second endcap 440 and a second gap separates the second set of parallel conductive fingers from the first endcap 430. A desirable capacitor structure may be achieved when the distance of the first gap is the same as the second gap in order to achieve a symmetrical structure. For example, a desirable capacitor structure may be achieved when a distance d between the third conductive finger 436 and the second endcap 440 is equal to a distance d between the sixth conductive finger 446 and the first endcap 430. When the distance d is not equal during fabrication, the MOM capacitor structure 400A is considered misaligned or staggered.

The first set of parallel conductive fingers are interdigitated with the second set of parallel conductive fingers at a first interconnect layer such that a third gap separates each of the first set of parallel conductive fingers from a one or more adjacent second set of parallel conductive fingers. A desirable capacitor structure may be achieved when the distance of the third gap separating the first set of parallel conductive fingers from one or more adjacent second set of parallel conductive fingers is the same. For example, a desirable capacitor structure may be achieved when a distance S (e.g., 50 nanometers (nm)) between the second conductive finger 434 and each of the fifth conductive finger 444 and the sixth conductive finger 446 is the same. When the distance S is not equal during fabrication, the MOM capacitor structure 400A is considered misaligned or staggered.

Referring to FIG. 4B, a top view of the MOM capacitor structure 400B illustrates misalignment (e.g., horizontal misalignment) in the interconnect layer and corresponding increased capacitor variance due to the misalignment in the interconnect layer during a fabrication process. For illustrative purposes, some of the labelling and numbering of the devices and features of FIG. 4B are similar to those of FIG. 4A.

During a fabrication process, such as a double patterning process, the MOM capacitor structure 400B may experience misalignment in the interconnect layer. For example, the process may include fabrication of two sets of parallel conductive fingers by two lithography masks. The misalignment in the interconnect layer may be random and may be a combination of horizontal and vertical misalignments in the interconnect layer. For example, an undesirable capacitor structure may result when a distance S1 (e.g., 60 nm) between the second conductive finger 434 and the sixth conductive finger 446 is different from a distance S2 (e.g., 40 nm) between the second conductive finger 434 and the fifth conductive finger 444. This follows because the change in the distance between the plates of the capacitor varies a capacitance c of the MOM capacitor structure 400B by delta c ($\Delta$c). This misalignment in the interconnect layer is deemed horizontal misalignment.

Referring to FIG. 4C, a top view of the metal-oxide-metal (MOM) capacitor structure 400C illustrates misalignment (e.g., vertical misalignment) in the interconnect layer. For illustrative purposes, some of the labelling and numbering of the devices and features of FIG. 4C are similar to those of FIG. 4A and FIG. 4B. During a fabrication process, such as a double patterning process, the MOM capacitor structure 400C may experience vertical shift that may not result in a variance in the capacitance. The lack of variance in the capacitance follows because the vertical shift causes a distance dl between the third conductive finger 436 and the second endcap 440 to be equal to a distance dl between the sixth conductive finger 446 and the first endcap 430. The variation between dl and d is much smaller than the finger length. Therefore, capacitance variation due to vertical misalignment can be ignored. Thus, the capacitance c of the MOM capacitor structure 400C is maintained.

Although the terms "vertical" and "horizontal" are used to illustrate the misalignment in the interconnect layer, the misalignment may be represented in other orientations depending on an orientation of the MOM capacitor structure or the orientation of an electronic device or system in which the MOM capacitor structure is implemented.

Figure 5A:
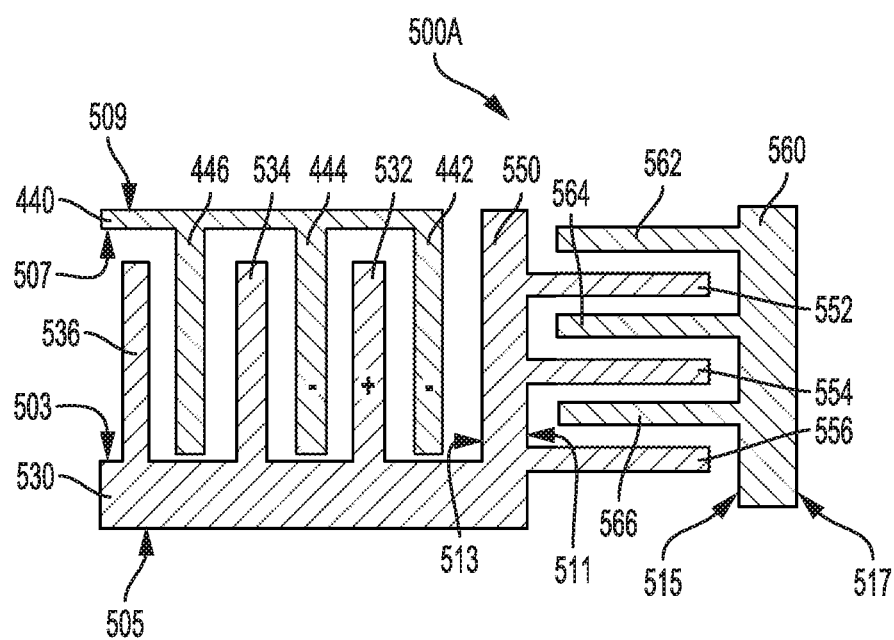
FIGS. 5A-5C illustrate top views of metal-oxide-metal (MOM) capacitor structures with reduced misalignment in an interconnect layer and reduced capacitance variance according to aspects of the present disclosure.
Figure 5C:
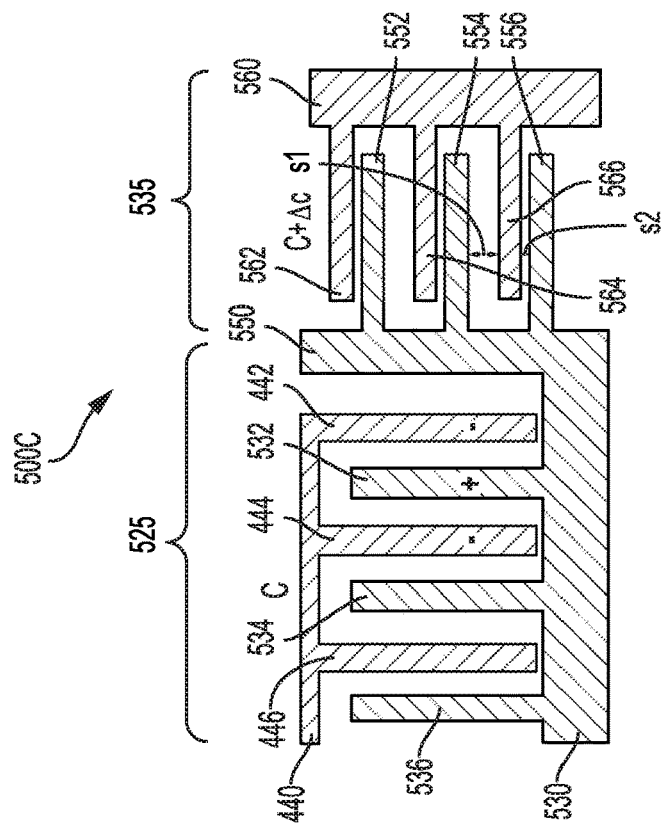
Figure 5B:
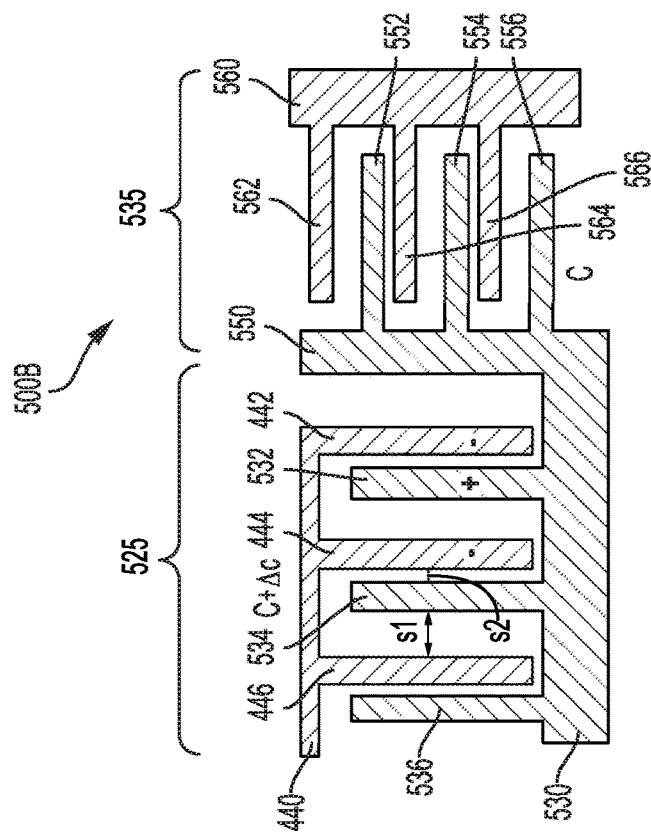

FIGS. 5A-5C illustrate top views of metal-oxide-metal (MOM) capacitor structures 500 (including MOM capacitor structure 500A, MOM capacitor structure 500B, and MOM capacitor structure 500C) with reduced misalignment in the interconnect layer and reduced capacitance variance, according to aspects of the present disclosure. For illustrative purposes, some of the labelling and numbering of the devices and features of FIGS. 5A-5C are similar to those of FIGS. 4A-4C. FIGS. 5A-5C are directed to MOM capacitor structures with smaller capacitance variance (relative to those of FIGS. 4A-4C). The capacitor structures are robust to misalignment during the double patterning process.

Referring to FIG. 5A, the top view of the MOM capacitor structure 500A is illustrated. The MOM capacitor structure 500A includes a first endcap having a first section 530 and a second section 550 that is orthogonally coupled to the first section 530. The MOM capacitor structure 500A further includes a first set of parallel conductive fingers that include a first conductive finger 532, a second conductive finger 534, and a third conductive finger 536. The first set of parallel conductive fingers is orthogonally coupled to the first section 530 of the first endcap. For example, the first conductive finger 532, the second conductive finger 534, and the third conductive finger 536 are orthogonally coupled to a first surface 503 of the first section 530 of the first endcap. The first surface 503 of the first section 530 is opposite a second surface 505 that is a free surface.

The MOM capacitor structure 500A further includes a third set of parallel conductive fingers that include a seventh conductive finger 552, an eighth conductive finger 554, and a ninth conductive finger 556. The third set of parallel conductive fingers is orthogonally coupled to the second section 550 of the first endcap. For example, the seventh conductive finger 552, the eighth conductive finger 554, and the ninth conductive finger 556 are orthogonally coupled to a first surface 511 of the second section 550 of the first endcap. The first surface 511 of the second section 550 is opposite a second surface 513 that is a free surface. The first section 530 and the second section 550 of the first endcap are of the first polarity (e.g., positive).

The MOM capacitor structure 500A further includes the second endcap 440 and a third endcap 560. The second set of parallel conductive fingers includes the fourth conductive finger 442, the fifth conductive finger 444, and the sixth conductive finger 446. The second set of parallel conductive fingers is orthogonally coupled to the second endcap 440. For example, the fourth conductive finger 442, the fifth conductive finger 444, and the sixth conductive finger 446 are orthogonally coupled to a first surface 507 of the second endcap 440. The first surface 507 of the second endcap 440 is opposite a second surface 509, which is a free surface. The first set of parallel conductive fingers and the second set of parallel conductive fingers are fabricated in a region that is partially surrounded by the first section 530 of the first endcap, the second section 550 of the first endcap, and the second endcap 440.

A fourth set of parallel conductive fingers includes a tenth conductive finger 562, an eleventh conductive finger 564, and a twelfth conductive finger 566. The fourth set of parallel conductive fingers are orthogonally coupled to the third endcap 560. For example, the tenth conductive finger 562, the eleventh conductive finger 564, and the twelfth conductive finger 566 are orthogonally coupled to a first surface 515 of the third endcap 560. The first surface 515 of the third endcap 560 is opposite a second surface 517, which is a free surface.

The first section 530 of the first endcap is parallel to the second endcap 440. Accordingly, the first set of parallel conductive fingers and the second set of parallel conductive fingers are between the first section 530 of the first endcap and the second endcap 440. The second section 550 of the first endcap is parallel to the third endcap 560. Accordingly, the third set of parallel conductive fingers and the fourth set of parallel conductive fingers are between the second section 550 of the first endcap and the third endcap 560.

The first set of parallel conductive fingers are interdigitated with the second set of parallel conductive fingers at a first interconnect layer. The third set of parallel conductive fingers are interdigitated with the fourth set of parallel conductive fingers. The first set of parallel conductive fingers and the third set of parallel conductive fingers are of the first polarity (e.g., positive). The second set of parallel conductive fingers and the fourth set of parallel conductive fingers are of the second polarity (e.g., negative).

In one aspect of the disclosure, a capacitance of the first set of parallel conductive fingers interdigitated with the second set of parallel conductive fingers is the same as a capacitance of the third set of parallel conductive fingers interdigitated with the fourth set of parallel conductive fingers.

The aspects of the present disclosure reduce the capacitance variance by as much as fifty percent (50%) relative to conventional implementations under similar conditions (e.g., under a same probability of variance). For a same amount of variance, the probability that the small amount of variance occurs is much smaller for the improved capacitor relative to the conventional implementations. The MOM capacitor structure can be fabricated with zero additional cost (e.g., for masking) relative to the conventional implementation.

FIGS. 5B and 5C illustrate that the aspects of the present disclosure reduce the capacitance variance by as much as fifty percent (50%) relative to conventional implementations under similar conditions (e.g., under a same probability of variance), whether the misalignment in the interconnect layer is horizontal or vertical. For illustrative purposes, some of the labelling and numbering of the devices and features of FIG. 5B and FIG. 5C are similar to those of FIG. 5A.

Referring to FIG. 5B, a top view of the MOM capacitor structure 500B is illustrated. FIG. 5B is directed to a first type of misalignment in a first direction (e.g., horizontal misalignment). The MOM capacitor structure 500B includes a first capacitor portion 525 and a second capacitor portion 535 that have a combination of parallel conductive fingers in a first direction (e.g., vertical direction) and a second direction (e.g., horizontal direction). In some aspects of the present disclosure, a capacitance of the first capacitor portion 525 is equal to a capacitance of the second capacitor portion 535. For example, the first conductive finger 532, the second conductive finger 534, the third conductive finger 536, the fourth conductive finger 442, the fifth conductive finger 444, and the sixth conductive finger 446 are in the vertical direction. The seventh conductive finger 552, the eighth conductive finger 554, the ninth conductive finger 556, the tenth conductive finger 562, the eleventh conductive finger 564, and the twelfth conductive finger 566 are in the horizontal direction.

A misalignment in the horizontal direction during fabrication processing (e.g., the horizontal misalignment) may only affect the first capacitor portion 525. For example, the horizontal misalignment occurs when a distance 51 (e.g., 60 nm) between the second conductive finger 534 and the sixth conductive finger 446 is different from a distance S2 (e.g., 40 nm) between the second conductive finger 534 and the fifth conductive finger 444. This follows because the horizontal misalignment between the plates of the MOM capacitor structure 500B varies the capacitance of the MOM capacitor structure 500B.

The capacitance variance resulting from the horizontal misalignment is only fifty percent of a capacitance variance of a conventional implementation because it may only affect the first capacitor portion 525 and not the second capacitor portion 535. For example, for a specified capacitance c, if the change in capacitance is delta c ($\Delta c$) for a conventional implementation, the variance of the conventional implementation is $\Delta c/c$. Thus, the variance for the aspects of the present disclosure is half (0.5 $\Delta c/c$) the variance of the conventional implementation.

Referring to FIG. 5C, a top view of the MOM capacitor structure 500C is illustrated. For illustrative purposes, some of the labelling and numbering of the devices and features of FIG. 5C are similar to those of FIG. 5A and FIG. 5B. FIG. 5C is directed to a second type of misalignment in a second direction (e.g., vertical misalignment).

A misalignment in the vertical direction (e.g., the vertical misalignment) may only affect the second capacitor portion 535. For example, the vertical misalignment occurs when a distance S1 (e.g., 60 nm) between the twelfth conductive finger 566 and the eighth conductive finger 554 is different from a distance S2 (e.g., 40 nm) between the twelfth conductive finger 566 and the ninth conductive finger 556. This follows because the vertical misalignment between the plates of the MOM capacitor structure 500C varies the capacitance of the MOM capacitor structure 500C.

The capacitance variance resulting from the vertical misalignment is only fifty percent of a capacitance variance of a conventional implementation because it may only affect the second capacitor portion 535 and not the first capacitor portion 525. For example, for a specified capacitance c, if the change in capacitance is delta c ($\Delta c$) for a conventional implementation, the variance of the conventional implementation is $\Delta c/c$. Thus, the variance for the new capacitor structure is half (0.5 $\Delta c/c$) the variance of the conventional implementation.

For example, consider that a probability of a maximal misalignment in an x-direction (e.g., horizontal misalignment) is P1 (e.g., 10%) and a probability of maximal misalignment in a y-direction is P2, which is also equal to P1. The two occurrences are independent of each other. As noted, the probability for misalignment in the x-direction yields a variance, for the new capacitor structure, of half (0.5 $\Delta c/c$) the variance of the conventional implementation. Thus, the capacitance variance decreases by 50% for a same probability. However, for misalignment in both the x and the y directions where the variance is $\Delta c/c$, the probability is given by the product of the two probabilities (e.g., P1*P1), which is equal to 1%. This probability of 1% is much smaller than a probability of 11% for conventional MOM capacitors. Thus, for a same amount of variance, the new capacitor structure has a smaller probability for misalignment in both the x and the y directions.

FIG. 6A and FIG. 6B respectively illustrate top views of first and second conductive interconnect layers of metal-oxide-metal (MOM) capacitor structures with reduced misalignment in each of the first and second conductive interconnect layers and reduced capacitance variance, according to aspects of the present disclosure.

Referring to FIG. 6A, a top view of a MOM capacitor structure 600A in a first conductive interconnect layer (Mx)

is illustrated. The MOM capacitor structure 600A is the same as the MOM capacitor structure 500A.

Referring to FIG. 6B, a top view of a MOM capacitor structure 600B in a second conductive interconnect layer (Mx−1) is illustrated. For example, the MOM capacitor structure 600B includes a first endcap having a first section 630 and a second section 650 that is orthogonally coupled to the first section 630. The first endcap of the MOM capacitor structure 600B and the first endcap of the MOM capacitor structure 600A may form a single endcap. In some aspects, the first endcap of the MOM capacitor structure 600B may be coupled to the first endcap of the MOM capacitor structure 600A by a via. In this aspect, the first endcap of the MOM capacitor structure 600B is aligned with the first endcap of the MOM capacitor structure 600A.

The MOM capacitor structure 600B further includes a first set of parallel conductive fingers, which includes a first conductive finger 632, a second conductive finger 634, and a third conductive finger 636. The first set of parallel conductive fingers of the MOM capacitor structure 600B is orthogonally coupled to the first section 630 of the first endcap of the MOM capacitor structure 600B.

The MOM capacitor structure 600B further includes a third set of parallel conductive fingers, which includes a seventh conductive finger 652, an eighth conductive finger 654, and a ninth conductive finger 656. The third set of parallel conductive fingers of the MOM capacitor structure 600B is orthogonally coupled to the second section 650 of the first endcap. The first section 630 and the second section 650 of the first endcap of the MOM capacitor structure 600B are of the first polarity (e.g., positive).

The MOM capacitor structure 600B further includes a second endcap 640 and a third endcap 660. The second set of parallel conductive fingers of the MOM capacitor structure 600B includes a fourth conductive finger 642, a fifth conductive finger 644, and a sixth conductive finger 646. The second set of parallel conductive fingers of the MOM capacitor structure 600B is orthogonally coupled to the second endcap 640. A fourth set of parallel conductive fingers of the MOM capacitor structure 600B includes a tenth conductive finger 662, an eleventh conductive finger 664, and a twelfth conductive finger 666. The fourth set of parallel conductive fingers of the MOM capacitor structure 600B is orthogonally coupled to the third endcap 660.

The first section 630 of the first endcap of the MOM capacitor structure 600B is parallel to the second endcap 640 of the MOM capacitor structure 600B. Accordingly, the first set of parallel conductive fingers of the MOM capacitor structure 600B and the second set of parallel conductive fingers of the MOM capacitor structure 600B are between the first section 630 of the first endcap and the second endcap 640 of the MOM capacitor structure 600B. The second section 650 of the first endcap of the MOM capacitor structure 600B is parallel to the third endcap 660 of the MOM capacitor structure 600B. Accordingly, the third set of parallel conductive fingers of the MOM capacitor structure 600B and the fourth set of parallel conductive fingers of the MOM capacitor structure 600B are between the second section 650 of the first endcap and the third endcap 660.

The first set of parallel conductive fingers of the MOM capacitor structure 600B is interdigitated with the second set of parallel conductive fingers of the MOM capacitor structure 600B at the second conductive interconnect layer Mx−1. The third set of parallel conductive fingers of the MOM capacitor structure 600B is interdigitated with the fourth set of parallel conductive fingers of the MOM capacitor structure 600B. The first set of parallel conductive fingers and the third set of parallel conductive fingers of the MOM capacitor structure 600B are of the first polarity (e.g., positive). The second set of parallel conductive fingers and the fourth set of parallel conductive fingers of the MOM capacitor structure 600B are of the second polarity (e.g., negative).

In one aspect of the disclosure, an overall capacitance of the first set of parallel conductive fingers interdigitated with the second set of parallel conductive fingers of the MOM capacitor structure 600B is the same as an overall capacitance of the third set of parallel conductive fingers interdigitated with the fourth set of parallel conductive fingers of the MOM capacitor structure 600B.

The conductive fingers of the first polarity of the MOM capacitor structure 600B have an inter-layer alignment relationship with respect to the conductive fingers of the first polarity of the MOM capacitor structure 600A. Similarly, the conductive fingers of the second polarity of the MOM capacitor structure 600B have an inter-layer alignment relationship with respect to the conductive fingers of the second polarity of the MOM capacitor structure 600A. Moreover, endcaps of the first polarity and the endcaps of the second polarity of the of the MOM capacitor structure 600B, respectively, have an inter-layer alignment relationship with respect to the endcaps of the first polarity and the endcaps of the second polarity of the MOM capacitor structure 600A. Thus, an inter-layer alignment exists between the conductive fingers of the first polarity of the first conductive interconnect layer Mx and the conductive fingers of the first polarity of the second conductive interconnect layer Mx−1. Similarly, an inter-layer alignment exists between the conductive fingers of the second polarity of the first conductive interconnect layer Mx and the conductive fingers of the second polarity of the second conductive interconnect layer Mx−1.

For example, the first endcap of the MOM capacitor structure 600B in the second conductive interconnect layer Mx−1 has an inter-layer alignment relationship with respect to the first endcap of the MOM capacitor structure 600A in the first conductive interconnect layer Mx. The first conductive finger 532, the second conductive finger 534, and the third conductive finger 536 of the MOM capacitor structure 600A, respectively, have an inter-layer alignment relationship with respect to the first conductive finger 632, the second conductive finger 634, and the third conductive finger 636 of the MOM capacitor structure 600B.

The fourth conductive finger 442, the fifth conductive finger 444, and the sixth conductive finger 446 of the MOM capacitor structure 600A, respectively, have an inter-layer alignment relationship with respect to the fourth conductive finger 642, the fifth conductive finger 644, and the sixth conductive finger 646 of the MOM capacitor structure 600B. The seventh conductive finger 552, the eighth conductive finger 554, and the ninth conductive finger 556 of the MOM capacitor structure 600A, respectively, have an inter-layer alignment relationship with respect to the seventh conductive finger 652, the eighth conductive finger 654, and the ninth conductive finger 656 of the MOM capacitor structure 600B. The tenth conductive finger 562, the eleventh conductive finger 564, and the twelfth conductive finger 566 of the MOM capacitor structure 600A, respectively, have an inter-layer alignment relationship with respect to the tenth conductive finger 662, the eleventh conductive finger 664, and the twelfth conductive finger 666 of the MOM capacitor structure 600B.

FIG. 6C illustrates a cross-section 600C of a portion of the multiple conductive interconnect layers of metal-oxide-metal (MOM) capacitor structures with reduced misalignment in one or more of the interconnect layers, according to aspects of the present disclosure. For illustrative purposes, some of the labelling and numbering of the devices and features of FIG. 6C are similar to those of FIGS. 6A and 6B.

For example, FIG. 6C illustrates an inter-layer alignment configuration between the MOM capacitor structure 600A in the first conductive interconnect layer Mx, the MOM capacitor structure 600B in the second conductive interconnect layer Mx−1 and a subsequent MOM capacitor structure in a subsequent conductive interconnect layer (e.g., third conductive interconnect layer Mx−2). The cross-section 600C corresponds to a cross-section along a first cross-sectional line 670. The cross-section 600C illustrates portions of the conductive interconnect layers (e.g., the first conductive interconnect layer Mx, the second conductive interconnect layer Mx−1, and a third conductive interconnect layer Mx−2).

The first conductive interconnect layer Mx of the cross-section 600C includes conductive fingers of the first polarity (e.g., the seventh conductive finger 552 and the eighth conductive finger 554 of the MOM capacitor structure 600A). The first conductive interconnect layer Mx of the cross-section 600C also includes conductive fingers of the second polarity (e.g., the tenth conductive finger 562 and the eleventh conductive finger 564 of the MOM capacitor structure 600A).

Similarly, the second conductive interconnect layer Mx−1 of the cross-section 600C includes conductive fingers of the first polarity (e.g., the seventh conductive finger 652 and the eighth conductive finger 654 of the MOM capacitor structure 600B). The second conductive interconnect layer Mx−1 of the cross-section 600C also includes conductive fingers of the second polarity (e.g., the tenth conductive finger 662 and the eleventh conductive finger 664 of the MOM capacitor structure 600B).

The third conductive interconnect layer Mx−2 of the cross-section 600C includes conductive fingers of the first polarity (e.g., a seventh conductive finger 672 and an eighth conductive finger 674 of a subsequent MOM capacitor structure (not shown in top view)). The third conductive interconnect layer Mx−2 of the cross-section 600C also includes conductive fingers of the second polarity (e.g., a tenth conductive finger 682 and an eleventh conductive finger 684 of the subsequent MOM capacitor structure (not shown in top view)).

In this aspect, the conductive fingers of the first polarity of the first conductive interconnect layer Mx, the second conductive interconnect layer Mx−1, and the third conductive interconnect layer Mx−2 have an inter-layer alignment relationship with respect to each other. For example, the seventh conductive finger 552 of the MOM capacitor structure 600A, overlaps (e.g., is directly over) the seventh conductive finger 652 of the MOM capacitor structure 600B, which overlaps (e.g., is directly over) the seventh conductive finger 672 of the MOM capacitor structure in the next layer (not shown in top view). Similarly, the tenth conductive finger 562 of the MOM capacitor structure 600A overlaps the tenth conductive finger 662 of the MOM capacitor structure 600B, which overlaps the tenth conductive finger 682 of the MOM capacitor structure in the next layer (not shown in top view).

FIG. 6D and FIG. 6E respectively illustrate top views of first and second conductive interconnect layers of metal-oxide-metal (MOM) capacitor structures with reduced misalignment in each of the first and second conductive interconnect layers, according to aspects of the present disclosure.

Referring to FIG. 6D, a top view of a MOM capacitor structure 600D in a first conductive interconnect layer (Mx) is illustrated. The MOM capacitor structure 600D is the same as the MOM capacitor structure 600A.

Referring to FIG. 6E, a top view of a MOM capacitor structure 600E in a second conductive interconnect layer (Mx−1) is illustrated. The MOM capacitor structure 600E is similar to the MOM capacitor structure 600B. However, the tenth conductive finger 662, the eleventh conductive finger 664, and the twelfth conductive finger 666 of the MOM capacitor structure 600E are staggered/offset relative to those of the MOM capacitor structure 600D in order to cause interlayer misalignment between the MOM capacitor structure 600D and the MOM capacitor structure 600E.

For example, the conductive fingers of the first polarity that are orthogonally coupled to the second section 550 of the first endcap of the MOM capacitor structure 600D have an inter-layer misalignment relationship with respect to the conductive fingers of the first polarity orthogonally coupled to the second section 650 of the first endcap of the MOM capacitor structure 600E. This inter-layer misalignment relationship is illustrated in FIG. 6F.

FIG. 6F illustrates a cross-section 600F of a portion of the multiple conductive interconnect layers of metal-oxide-metal (MOM) capacitor structures with reduced misalignment in one or more of the interconnect layers, according to aspects of the present disclosure. For illustrative purposes, some of the labelling and numbering of the devices and features of FIG. 6F are similar to those of FIGS. 6A, 6B and 6C.

FIG. 6F illustrates an inter-layer misalignment configuration between the MOM capacitor structure 600D in the first conductive interconnect layer Mx, the MOM capacitor structure 600E in the second conductive interconnect layer Mx−1 and MOM capacitor structure in a subsequent conductive interconnect layer (e.g., a third conductive interconnect layer Mx−2) not shown in top view. The cross-section 600F corresponds to a cross-section along a second cross-sectional line 680. The cross-section 600F illustrates portions of the conductive interconnect layers (e.g., the first conductive interconnect layer Mx, the second conductive interconnect layer Mx−1, and the third conductive interconnect layer Mx−2).

The first conductive interconnect layer Mx of the cross-section 600F includes conductive fingers of the first polarity (e.g., the seventh conductive finger 552 and the eighth conductive finger 554 of the MOM capacitor structure 600D). The first conductive interconnect layer Mx of the cross-section 600F also includes conductive fingers of the second polarity (e.g., the tenth conductive finger 562 and the eleventh conductive finger 564 of the MOM capacitor structure 600D).

Similarly, the second conductive interconnect layer Mx−1 of the cross-section 600F includes conductive fingers of the first polarity (e.g., the seventh conductive finger 652 and the eighth conductive finger 654 of the MOM capacitor structure 600E). The second conductive interconnect layer Mx−1 of the cross-section 600F also includes conductive fingers of the second polarity (e.g., the tenth conductive finger 662 and the eleventh conductive finger 664 of the MOM capacitor structure 600E).

The third conductive interconnect layer Mx−2 of the cross-section 600F includes conductive fingers of the first polarity (e.g., the seventh conductive finger 672 and the eighth conductive finger 674 of the MOM capacitor structure of a next layer (not shown in top view)). The third conductive interconnect layer Mx−2 of the cross-section 600F also includes conductive fingers of the second polarity (e.g., the tenth conductive finger 682 and the eleventh conductive finger 684 of the MOM capacitor structure of the next layer (not shown in top view)).

In this aspect, the conductive fingers of the first polarity of the first conductive interconnect layer Mx, the second conductive interconnect layer Mx−1, and the third conductive interconnect layer Mx−2 have an inter-layer misalignment relationship with respect to each other. For example, the seventh conductive finger 552 of the MOM capacitor structure 600D, overlaps (e.g., is directly over) the tenth conductive finger 662 of the MOM capacitor structure 600E, which overlaps (e.g., is directly over) the seventh conductive finger 672 of the subsequent layer (not shown in top view). Similarly, the tenth conductive finger 562 of the MOM capacitor structure 600D overlaps the seventh conductive finger 652 of the MOM capacitor structure 600E, which overlaps the tenth conductive finger 682 of the subsequent layer (not shown in top view). Thus, in this aspect, the conductive fingers of the first polarity are alternately aligned with the conductive fingers of the second polarity.

Figure 7:
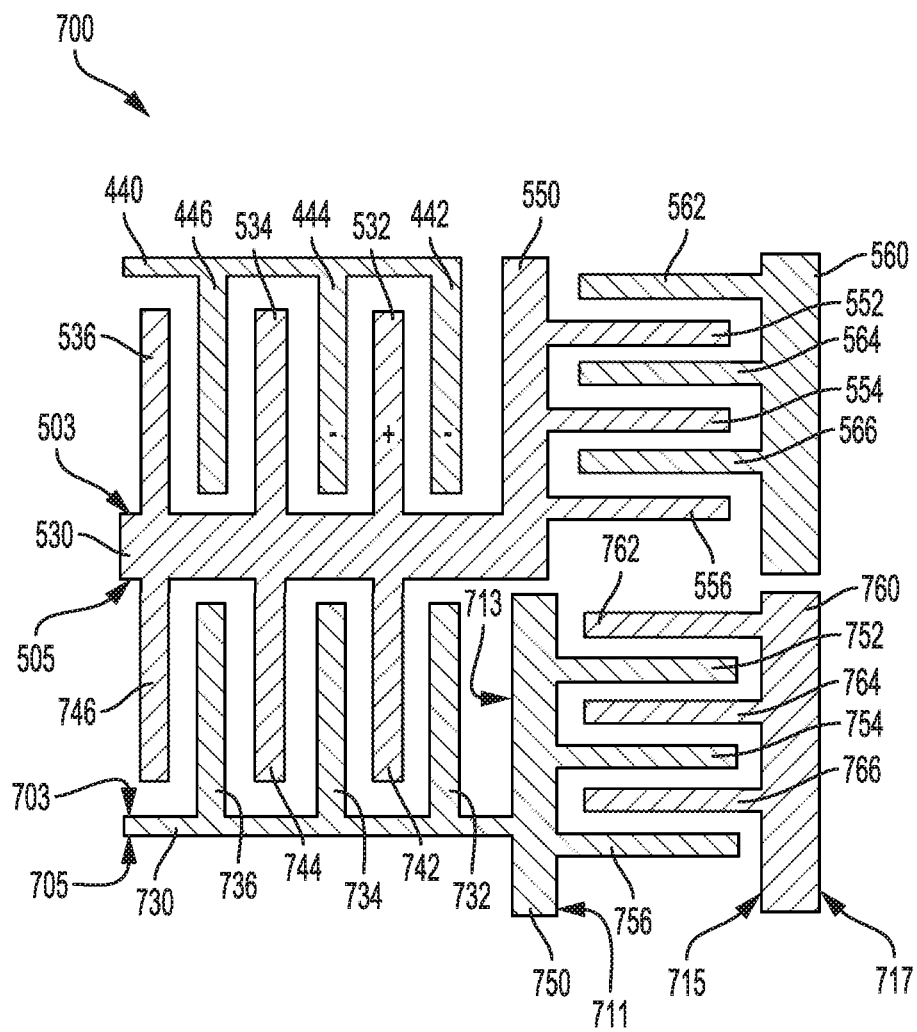
FIG. 7 illustrates a top view of a metal-oxide-metal (MOM) capacitor structure with reduced misalignment in the interconnect layer and reduced capacitance variance, according to aspects of the present disclosure.

FIG. 7 illustrates a top view of a metal-oxide-metal (MOM) capacitor structure 700 with reduced misalignment, according to additional aspects of the present disclosure. For illustrative purposes, some of the labelling and numbering of the devices and features of FIG. 7 are similar to those of FIGS. 5A-5C and FIGS. 6A-6F. However, instead of the second surface 505 of the first section 530 of the first endcap being a free surface, as in FIG. 5A (for example), a fifth set of (e.g., positive) conductive fingers are orthogonally coupled to the second surface 505 of the first section 530. For example, each of the fifth set of conductive fingers (e.g., a thirteenth conductive finger 742, a fourteenth conductive finger 744, and a fifteenth conductive finger 746) is orthogonally coupled to the second surface 505 of the first section 530 of the MOM capacitor structure 700.

The MOM capacitor structure 700 includes a fourth endcap having a first section 730 and a second section 750 that is orthogonally coupled to the first section 730. The MOM capacitor structure 700 further includes a sixth set of parallel conductive fingers (e.g., of the second polarity), which include a sixteenth conductive finger 732, a seventeenth conductive finger 734, and an eighteenth conductive finger 736. The sixth set of parallel conductive fingers is orthogonally coupled to the first section 730 of the fourth endcap. For example, the sixteenth conductive finger 732, the seventeenth conductive finger 734, and the eighteenth conductive finger 736 are orthogonally coupled to a first surface 703 of the first section 730 of the fourth endcap. The first surface 703 of the first section 730 is opposite a second surface 705, which is a free surface.

The MOM capacitor structure 700 further includes a seventh set of parallel conductive fingers, which include a nineteenth conductive finger 752, a twentieth conductive finger 754, and a twenty-first conductive finger 756. The seventh set of parallel conductive fingers is orthogonally coupled to the second section 750 of the fourth endcap. For example, the nineteenth conductive finger 752, the twentieth conductive finger 754, and the twenty-first conductive finger 756 are orthogonally coupled to a first surface 711 of the second section 750 of the fourth endcap. The first surface 711 of the second section 750 is opposite a second surface 713, which is a free surface. The first section 730 and the second section 750 of the fourth endcap are of the second polarity.

The MOM capacitor structure 700 further includes a fifth endcap 760. An eighth set of parallel conductive fingers include a twenty-second conductive finger 762, a twenty-third conductive finger 764, and a twenty-fourth conductive finger 766. The eighth set of parallel conductive fingers is orthogonally coupled to the fifth endcap 760. For example, the twenty-second conductive finger 762, the twenty-third conductive finger 764, and the twenty-fourth conductive finger 766 are orthogonally coupled to a first surface 715 of the fifth endcap 760. The first surface 715 of the fifth endcap 760 is opposite a second surface 717, which is a free surface.

The first section 730 of the fourth endcap is parallel to the first section 530 of the first endcap. The second section 750 of the fourth endcap is parallel to the fifth endcap 760.

Figure 8:
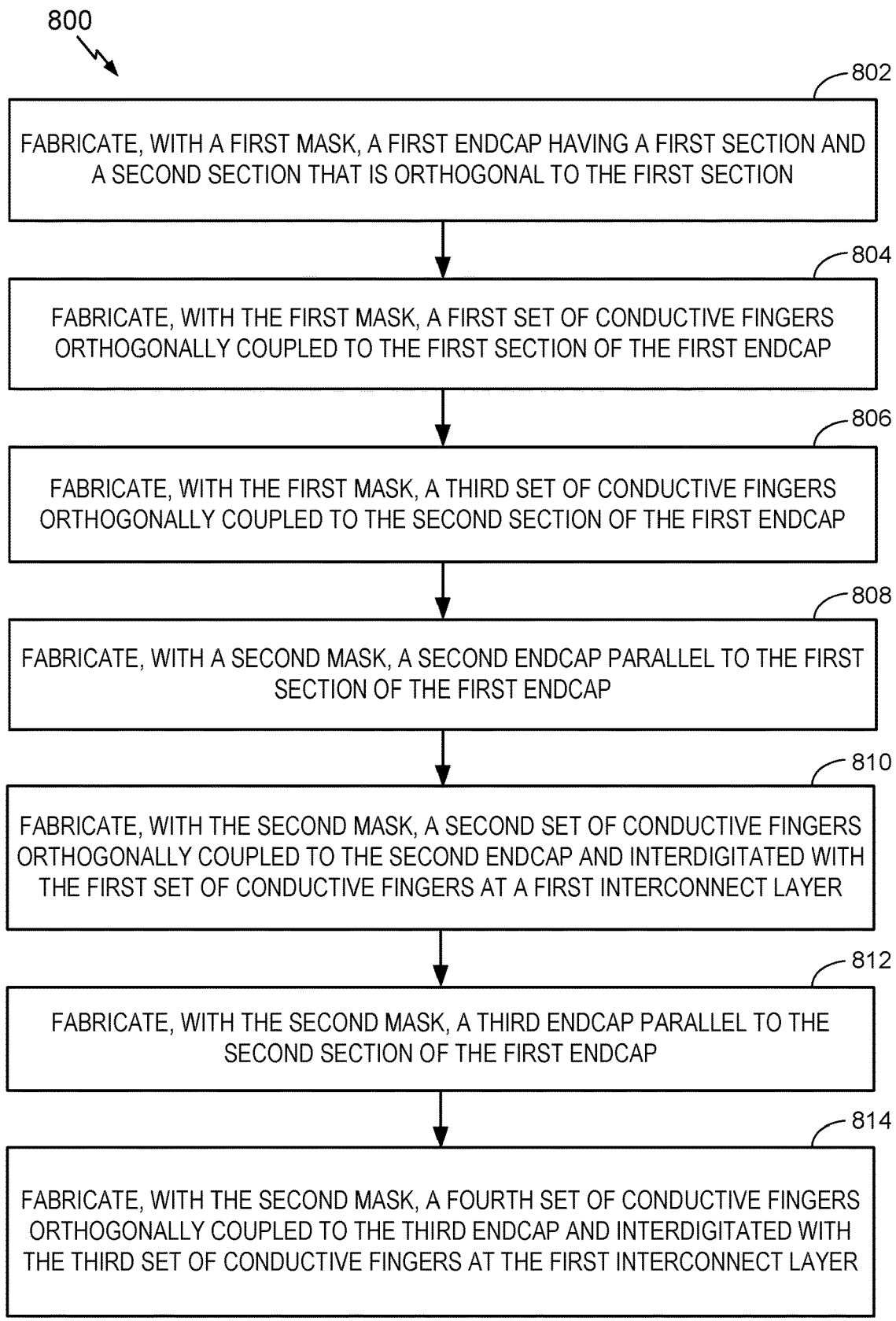
FIG. 8 is a process flow diagram illustrating a method for fabricating a metal-oxide-metal (MOM) capacitor with reduced misalignment in the interconnect layer and reduced capacitance variance, according to aspects of the present disclosure.

FIG. 8 is a process flow diagram illustrating a method 800 for fabricating a metal-oxide-metal (MOM) capacitor with reduced misalignment and reduced capacitance variance, according to aspects of the present disclosure. In block 802, a first endcap having a first section and a second section that is orthogonal to the first section is fabricated with a first mask. In block 804, a first set of conductive fingers orthogonally coupled to the first section of the first endcap is fabricated with the first mask. In block 806, a third set of conductive fingers orthogonally coupled to the second section of the first endcap is fabricated with the first mask. In block 808, a second endcap parallel to the first section of the first endcap is fabricated with a second mask.

In block 810, a second set of conductive fingers orthogonally coupled to the second endcap and interdigitated with the first set of conductive fingers at a first interconnect layer is fabricated with the second mask. In block 812, a third endcap parallel to the second section of the first endcap is fabricated with the second mask. In block 814, a fourth set of conductive fingers orthogonally coupled to the third endcap and interdigitated with the third set of conductive fingers at the first interconnect layer is fabricated with the second mask.

According to a further aspect of the present disclosure, a capacitor includes first means for receiving/transmitting charge to/from the capacitor and second means for receiving/transmitting charge to/from the capacitor. In one configuration, the first charge receiving/transmitting means may be the second endcap 440, as shown in FIGS. 4, 6A, 6D and 7. In one configuration, the second charge receiving/transmitting means may be the third endcap 560, as shown in FIGS. 6A, 6D and 7. In another aspect, the aforementioned means may be any structure or any material configured to perform the functions recited by the aforementioned means.

Figure 9:
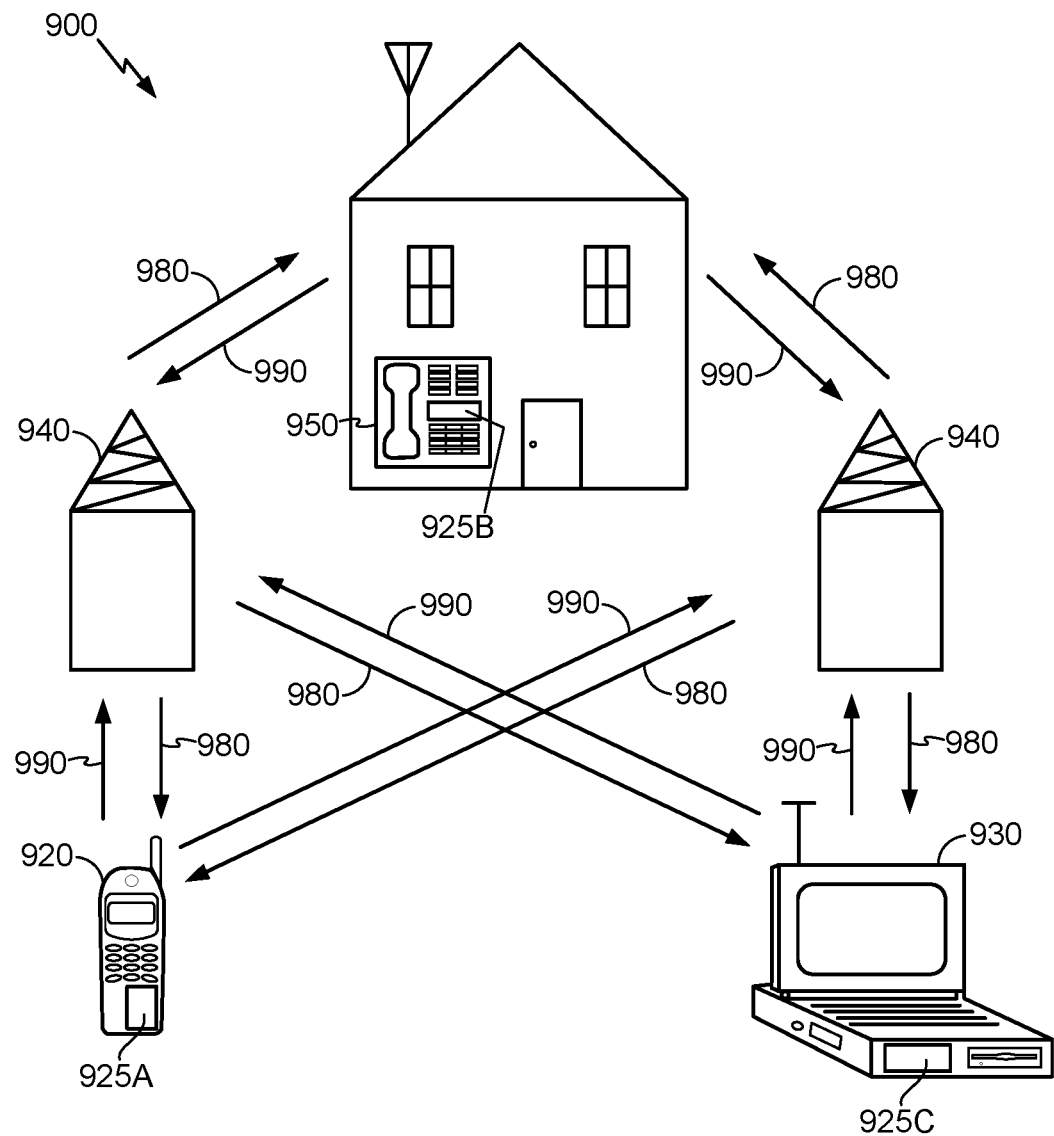
FIG. 9 is a block diagram showing an exemplary wireless communication system in which a configuration of the present disclosure may be advantageously employed.

FIG. 9 is a block diagram showing an exemplary wireless communication system 900 in which an aspect of the present disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C, and 925B that include the disclosed capacitor. It will be recognized that other devices may also include the disclosed capacitor, such as the base stations, switching devices, and network equipment. FIG. 9 shows forward link signals 980 from the base station 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit, such as a personal data assistant, a GPS enabled device, a navigation device, a set top box, a music player, a video player, an entertainment unit, a fixed location data unit, such as a meter reading equipment, or other device that stores or retrieves data or computer instructions, or combinations thereof. Although FIG. 9 illustrates remote units, according to the aspects of the present disclosure, the present disclosure is not limited to these exemplary illustrated units. Aspects of the present disclosure may be suitably employed in many devices, which include the disclosed capacitor.

Figure 10:
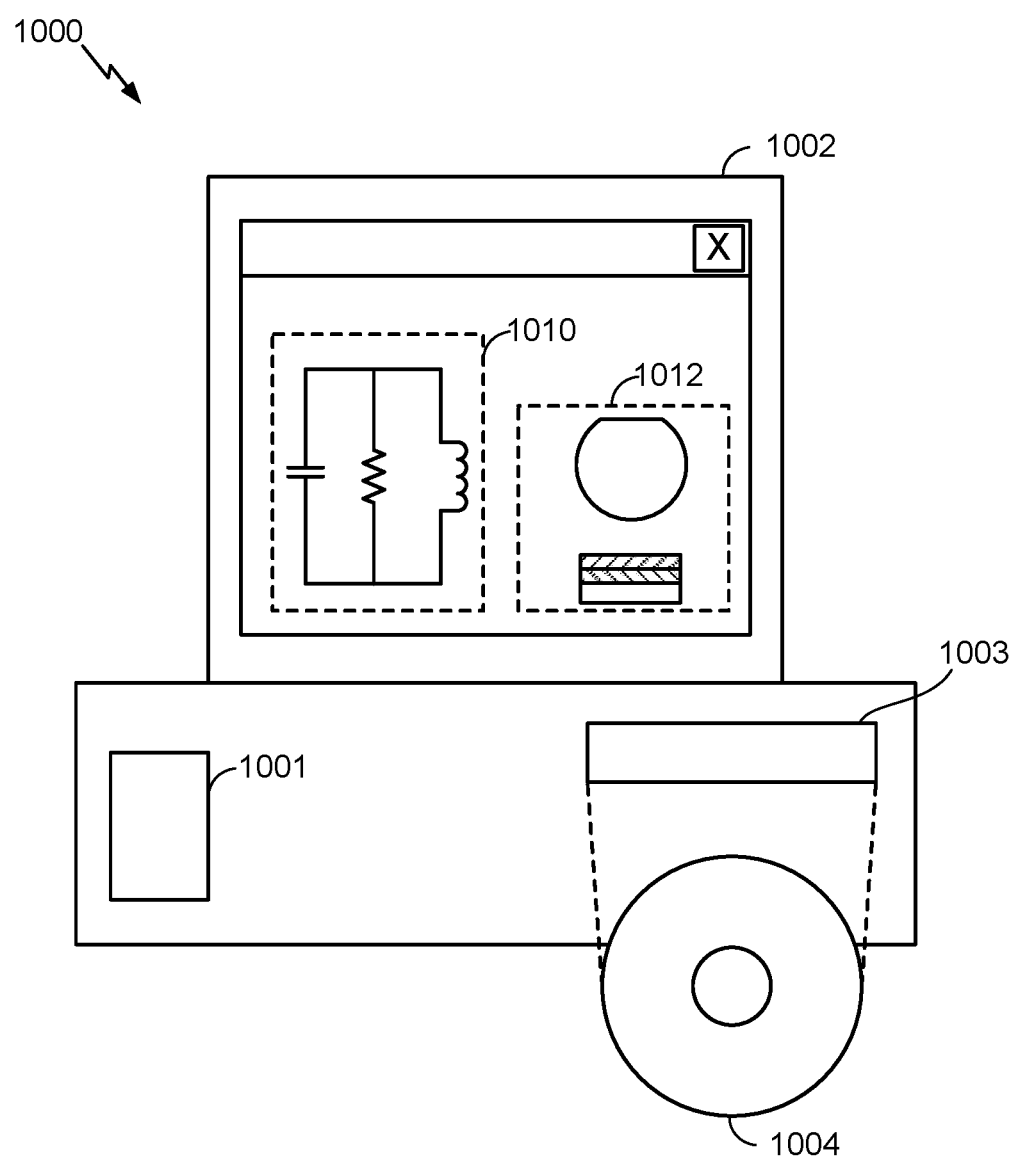
FIG. 10 is a block diagram illustrating a design workstation used for circuit, layout, and logic design of a semiconductor component, according to one configuration.

FIG. 10 is a block diagram illustrating a design workstation used for circuit, layout, and logic design of a semiconductor component, such as the capacitors disclosed above. A design workstation 1000 includes a hard disk 1001 containing operating system software, support files, and design software such as Cadence or OrCAD. The design workstation 1000 also includes a display 1002 to facilitate design of a circuit 1010 or an RF component 1012 such as a capacitor. A storage medium 1004 is provided for tangibly storing the design of the circuit 1010 or the RF component 1012 (e.g., the capacitor). The design of the circuit 1010 or the RF component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the RF component 1012 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized, according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

The previous description of the present disclosure is provided to enable any person skilled in the art to make or use the present disclosure. Various modifications to the present disclosure will be readily apparent to those skilled in the art, and the generic principles defined herein may be applied to other variations without departing from the spirit or scope of the present disclosure. Thus, the present disclosure is not intended to be limited to the examples and designs described herein but is to be accorded the widest scope consistent with the principles and novel features disclosed herein.

What is claimed is:

1. A capacitor, comprising:
   a first endcap having a first section and a second section that is orthogonal to the first section, the capacitor consisting of a first interdigitated finger section associated with the first section of the first endcap and a second interdigitated finger section associated with the second section of the first endcap;
   a first set of conductive fingers orthogonally coupled to the first section of the first endcap;
   a third set of conductive fingers orthogonally coupled to the second section of the first endcap;
   a second endcap parallel to the first section of the first endcap;
   a second set of conductive fingers orthogonally coupled to the second endcap and interdigitated with the first set of conductive fingers at a first interconnect layer in the first interdigitated finger section;
   a third endcap parallel to the second section of the first endcap; and
   a fourth set of conductive fingers orthogonally coupled to the third endcap and interdigitated with the third set of conductive fingers at the first interconnect layer in the second interdigitated finger section.

2. The capacitor of claim 1, in which a capacitance of the second set of conductive fingers interdigitated with the first set of conductive fingers is the same as a capacitance of the fourth set of conductive fingers interdigitated with the third set of conductive fingers.

3. A capacitor, comprising:
   a first endcap having a first section and a second section that is orthogonal to the first section, the capacitor consisting of a first interdigitated finger section associated with the first section of the first endcap and a second interdigitated finger section associated with the second section of the first endcap;
   a first set of conductive fingers orthogonally coupled to the first section of the first endcap;
   a third set of conductive fingers orthogonally coupled to the second section of the first endcap;
   first means for receiving/transmitting charge to/from the capacitor, the first charge receiving/transmitting means parallel to the first section of the first endcap;
   a second set of conductive fingers orthogonally coupled to the first charge receiving/transmitting means and interdigitated with the first set of conductive fingers at a first interconnect layer in the first interdigitated finger section;
   second means for receiving/transmitting charge to/from the capacitor, the second charge receiving/transmitting means parallel to the second section of the first endcap; and
   a fourth set of conductive fingers orthogonally coupled to the second charge receiving/transmitting means and interdigitated with the third set of conductive fingers at the first interconnect layer in the second interdigitated finger section.

4. The capacitor of claim 3, in which a capacitance of the second set of conductive fingers interdigitated with the first set of conductive fingers is the same as a capacitance of the fourth set of conductive fingers interdigitated with the third set of conductive fingers.

\* \* \* \* \*